United States Patent [19]

Wu et al.

[11] 4,230,505

[45] Oct. 28, 1980

[54] METHOD OF MAKING AN IMPATT DIODE UTILIZING A COMBINATION OF EPITAXIAL DEPOSITION, ION IMPLANTATION AND SUBSTRATE REMOVAL

[75] Inventors: Chung P. Wu, Trenton; Arye Rosen, Cherry Hill, both of N.J.

[73] Assignee: RCA Corporation, New York, N.Y.

[21] Appl. No.: 82,733

[22] Filed: Oct. 9, 1979

[51] Int. Cl.³ .................. H01L 21/265; H01L 21/20; H01L 21/306; H01L 21/324
[52] U.S. Cl. .................................. 148/1.5; 29/576 B; 29/580; 148/175; 156/649; 156/657; 156/662; 357/4; 357/13; 357/89; 357/91
[58] Field of Search ................ 148/1.5, 175; 156/649, 156/657, 662; 357/4, 12, 13, 89, 91; 29/576 B, 580

[56] References Cited

U.S. PATENT DOCUMENTS

| | | | |
|---|---|---|---|
| 3,223,560 | 12/1965 | Millington | 148/1.5 |
| 3,600,649 | 8/1971 | Liu | 357/13 |
| 3,628,185 | 12/1971 | Evans et al. | 357/13 X |
| 3,846,198 | 11/1974 | Wen et al. | 156/659 X |
| 3,916,427 | 10/1975 | Ying et al. | 357/13 |
| 4,064,620 | 12/1977 | Lee et al. | 148/175 X |
| 4,181,538 | 1/1980 | Narayan et al. | 148/1.5 |

OTHER PUBLICATIONS

Seidel et al., "Double-Drift-Region Ion-Implanted . . . Impatt Diode", Proc. IEEE, vol. 59, No. 8, Aug. 1971, pp. 1222–1228.

Hammerschmitt, J., "Silicon Snap-Off . . . Impatt Diode . . . ", Siemens Review, vol. 42, No. 1, Jan. 1975, pp. 44–47.

Ino et al., "Submillimeter Wave Si . . . Impatt Diodes", Jap. J. Applied Phys., vol. 16, 1977, pp. 89–92.

*Primary Examiner*—L. Dewayne Rutledge
*Assistant Examiner*—W. G. Saba
*Attorney, Agent, or Firm*—Birgit E. Morris; Donald S. Cohen

[57] ABSTRACT

A method of making an Impatt diode capable of operating at millimeter wave frequencies in which an epitaxial layer of the thickness desired for the diode is deposited on a substrate. Conductivity modifiers are implanted into the epitaxial layer to form one active region and a high conductivity region between the one active region and the surface of the epitaxial layer. A heat sink which also serves as a handle is formed on the epitaxial layer. The substrate is removed and conductivity modifiers are implanted into the other side of the epitaxial layer to the other active region and a high conductivity region between the other active region and the other surface of the epitaxial layer. After the implants the epitaxial layer is annealed. After the first implants the epitaxial layer may be annealed by either thermal or laser annealing. However, after the second implants the epitaxial layer must be laser annealed.

13 Claims, 7 Drawing Figures

METHOD OF MAKING AN IMPATT DIODE UTILIZING A COMBINATION OF EPITAXIAL DEPOSITION, ION IMPLANTATION AND SUBSTRATE REMOVAL

BACKGROUND OF THE INVENTION

The present invention relates to a method of making an Impatt diode and particularly to a method of making a high power Impatt diode suitable for millimeter wave applications.

Recently there has been much interest in developing electronic equipment which operates at millimeter wave-frequency. For use in this equipment, high power Impatt diodes have been developed which operate at these frequencies. Such diodes in general comprise a body of semiconductor material, such as silicon, having adjacent active regions of opposite conductivity types forming a PN junction therebetween, and a separate high conductivity region between each of the active regions and an adjacent surface of the body. Each of the high conductivity regions is of the same conductivity type as its adjacent active region. For operation at millimeter wave frequencies the active regions must be very thin, no greater than one micron. Also, to achieve efficient operation at a desired frequency, the conductivity of the various regions and the profile of the conductivity modifier therein must be accurately controlled.

One technique which has been used to make Impatt diodes is to start with a wafer of one conductivity type and diffuse into opposite surfaces of the wafer conductivity modifiers to form the various regions. Another technique which has been used is to epitaxially deposit in succession on a surface of a substrate various layers of the desired conductivity type with each layer forming one of the regions of the diode. The substrate is then removed by an etching technique. However, to form the regions having the narrow thickness and having the desired profiles of the conductivity modifiers required for operation at millimeter wave frequencies by either of these techniques is very difficult. Thus, these techniques are not suitable for commercial production of high power Impatt diodes which will operate at millimeter wave frequencies.

SUMMARY OF THE INVENTION

An Impatt diode capable of operating at millimeter wave frequencies is made by first epitaxially depositing a layer of a semiconductor material of one conductivity type on a substrate. A conductivity modifier is implanted into the one exposed surface of the layer to form a first active region across the layer. The substrate is removed to expose the other surface of the layer. A conductivity modifier is implanted into the other surface of the layer to form a second active region with a PN junction between the two active regions.

Detailed Description

Figure 1:
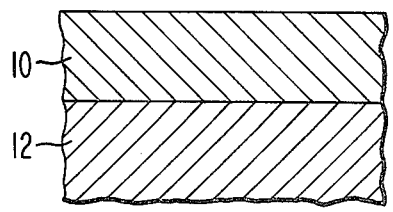
FIGS. 1–7 are sectional views illustrating the various steps of the method of the present invention.

To make a high power Impatt diode capable of operating at millimeter wave frequencies in accordance with the method of the present invention, a layer of N type silicon 10 is epitaxially deposited on the surface of a substrate 12 of N+ type silicon as shown in FIG. 1. The layer 10 may be deposited on the substrate 12 by any well known epitaxial technique, such as by the thermal decomposition of a gas containing silicon, such as silane or chlorosilane. The gas would also include an N type conductivity modifier, such as phosphorus or arsenic. The phosphorus can be obtained from phosphine and the arsenic can be obtained from arsine. The layer 10 is of a thickness corresponding to the desired thickness of the Impatt diode being formed. For example, the layer 10 may be of a thickness of 1.5 to 2 microns for a diode which operates at about 100 GHz to about 0.74 micron for a diode which operates at about 220 GHz. The concentration of the conductivity modifier in the layer 10 should be close to that desired for the N type region of the implanted diode but such that it can be easily counterdoped to achieve the P type region. Typically the layer 10 can have a conductivity modifier concentration of about $5 \times 10^{16}$ Cm$^{-3}$.

Figure 2:
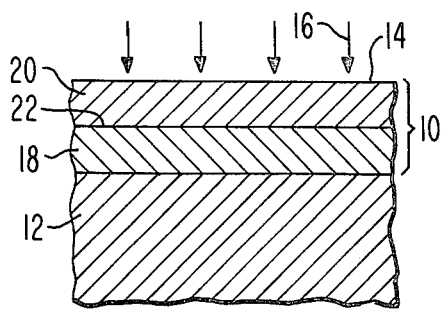
Figure 3:
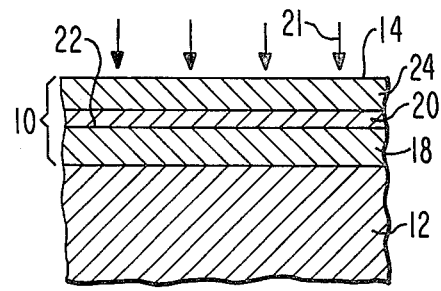
Figure 7:
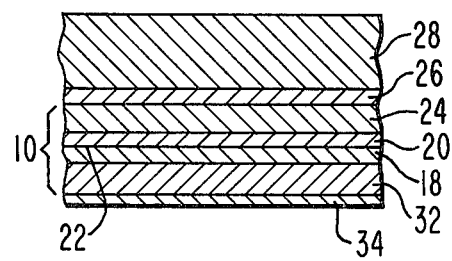
Figure 4:
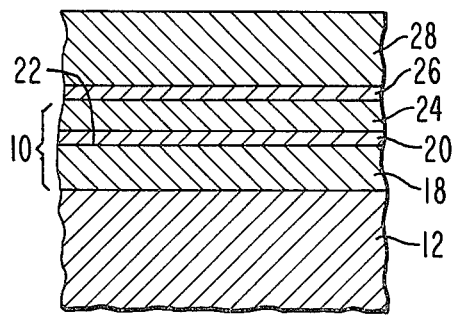

As shown in FIG. 2, a P type conductivity modifier, such as boron, is implanted into the exposed surface 14 of the layer 10 as indicated by the arrow 16. The boron atoms are implanted to a depth equal to the combined thicknesses of the desired P type region and P+ type region which will vary depending on the desired operating frequency of the diode. The concentration of the boron atoms implanted is equal to that desired for the active P type region of the diode. This provides the layer 10 with an N type portion 18 and a P type portion 20, with a PN junction 22 therebetween. As shown in FIG. 3, additional P type conductivity modifiers, such as boron, are implanted into the P type portion 20 as indicated by the arrows 21 to a depth spaced from the PN junction 22 corresponding to the desired thickness of the active P type region of the Impatt diode. This provides a P+ region 24 between the P type region 20 and the surface 14 of the layer 10.

After these two implant steps the layer 10 and the substrate 12 are annealed to remove any damage. This may be achieved by a thermal anneal in which the layer 10 and the substrate are heated at about 1000° C. in dry nitrogen for about 15 minutes. Alternatively, the layer 10 may be annealed by laser annealing which employs a pulse laser with pulse width of 25 to 50 ns and pulse energy density of 1 to 2 J/cm$^2$.

A conductive contact layer 26 is then coated over the surfacw 14 of the layer 10. The contact layer 26 may be of any material which forms good ohmic contact to the silicon layer 10. For example, the contact layer 26 may be a thin film of chromium directly on the surface 14 covered by a thin film of platinum which in turn is covered with a thin film of gold. Each of these thin films may be applied by the well known techniques of evaporation in a vacuum. A relatively thick copper heat sink 28 is then electroplated onto the contact layer 26. The heat sink 28 will also serve as a handle for holding the silicon layer 10 during the further steps of this method, as will be explained.

Figure 5:
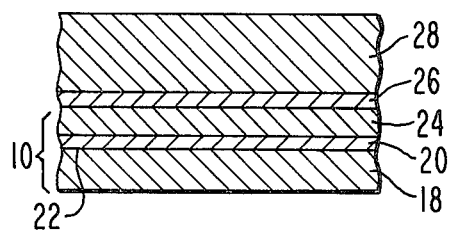

As shown in FIG. 5, the substrate 12 is then removed to expose the other surface 30 of the silicon layer 10. The substrate 12 can be removed with a selective etchant, such as 8CH$_3$COOH:3HNO$_3$:1HF. This etchant will remove N+ type silicon and will stop at the N type layer 10. However, if desired other known etchants for silicon, such as a mixture of 92% by volume of nitric acid and 8% by volume of hydrofluoric acid, can be used for removing a major portion of the substrate 12 and the selective etchant used for removing the final amount of the substrate up to the layer 10.

Figure 6:
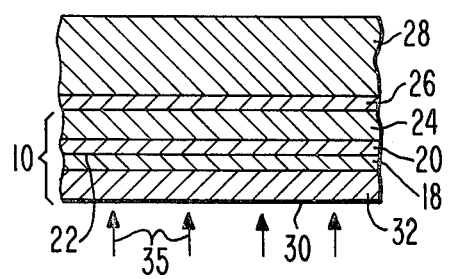

As shown in FIG. 6 an N type conductivity modifier such as phosphorus is implanted into the layer 10 through the surface 30 as indicated by the arrows 35, to a depth spaced from the PN junction 22 a distance equal to the desired thickness of the N type active region. This forms an N+ region 32 between the N region 18 and the surface 30 of the layer 10. Additional N type conductivity modifiers are then implanted into the N region 18 to increase the conductivity modifier concentration to that desired for the N type active region of the Impatt diode. The N region 18 and N+ portion 36 are then laser annealed. Laser annealing is required here since it heats only the implanted regions and does not affect the metal of the contact layer 26 or the heat sink 28. Thus, the deleterious effect that would result if the entire device was thermally annealed is avoided. The surface 30 is then coated with a contact layer 34 which can be of the same materials as the contact layer 26. The layer 10 is then formed into individual Impatt diodes by etching annular grooves through the layer 10 from the surface 30 to the contact layer 26 to form individual mesas on the heat sink 28. The heat sink 28 is then cut along lines between the mesas to divide it into individual pieces having a separate diode mounted thereon.

EXAMPLE 1

An Impatt diode which will operate at a frequency of about 140 GHz can be made by epitaxially depositing a layer of N type silicon on the [111] oriented surface of an N+ type silicon substrate. The epitaxial layer can be deposited by thermally decomposing a mixture of silane and arsine at 1000° C. to form the silicon layer doped with arsenic. The layer is deposited until it is 1 micron in thickness and it has a concentration of arsenic atoms of $5 \times 10^{16}$ cm$^{-3}$. Boron atoms are then implanted into the silicon layer at 240 KeV with a fluence of $6.5 \times 10^{12}$ cm$^{-2}$ to achieve a P type region having a carrier concentration of $2 \times 10^{17}$ cm$^{-3}$ and a thickness of 0.75 micron from the surface of the layer. This is followed by an implantation of boron atoms at 40 KeV with fluence of $1.5 \times 10^{15}$ cm$^{-2}$. This form a P+ layer along the surface of the silicon layer, which P+ layer is of a thickness of 0.5 micron and a carrier concentration of $5 \times 10^{19}$ cm$^{-3}$. This leaves a P type active region 0.25 micron thick between the P+ region and the N type portion of the silicon layer. A 0.5 micron layer of silicon dioxide is coated over the surface of the silicon layer by thermally decomposing silane and water vapor. The implanted silicon layer is then thermally annealed at 1000° C. in dry nitrogen for 15 minutes.

The silicon dioxide layer is then removed with buffered HF and a thin layer of chromium is deposited on the surface of the silicon layer followed by a thin layer of platinum and then a thin layer of gold. All three metal layers can be deposited by evaporation in a vacuum. A 25 micron thick copper heat sink is then electroplated onto the gold layer and a very thin gold protective layer, about 2 to 3 microns thick, is plated on top of the copper heat sink.

The N+ silicon substrate is then removed, first using an etching solution of 92% by volume of nitric acid and 8% by volume of hydrofluoric acid, followed by a final etching in a solution 8CH$_3$COOH:3HNO$_3$:1HF. This completely removes the N+ substrate to expose the other surface of the N type silicon layer. Phosphorus ($^{31}$P+) ions are then implanted into the now exposed surface of the N type silicon layer at 130 KeV, with a fluence of $1.5 \times 10^{15}$ cm$^{-2}$. This forms a N+ region about 0.5 micron thick and a carrier concentration of $5 \times 10^{19}$ cm$^{-3}$ along the other surface of the silicon layer. Additional phosphorus ($^{31}$P++) ions with fluence of $7 \times 10^{12}$ cm$^{-2}$ are implanted into the exposed surface of the silicon layer at 280 KeV. This adjusts the carrier concentration in the N region which is between the N+ region and the P region to $2 \times 10^{17}$ cm$^{-3}$. The exposed surface of the silicon layer is then laser annealed with a single ruby laser pulse having a pulse width of about 25 ns and an energy density of about 1 to 2 J/cm$^2$. The exposed surface of the silicon layer is coated with a thin film of chromium followed by a thin film of platinum and finally with a thin film of gold, all by evaporation in a vacuum.

EXAMPLE 2

An Impatt diode which will operate at about 220 GHz can be made in the same manner as described in Example 1 except that the epitaxial layer is about 0.74 micron in thickness, the P type region is formed by ion implanting boron atoms at 90 KeV with fluence of $1.8 \times 10^{13}$ cm$^{-2}$ to form a P type region having a carrier concentration of $5.2 \times 10^{17}$ cm$^{-3}$. The P+ region having a carrier concentration of $5 \times 10^{19}$ cm$^{-3}$ is formed by ion implanting boron at 20 KeV with fluence of $7 \times 10^{14}$ cm$^{-2}$. The P+ region has a thickness of about 0.25 micron leaving a P type region of about 0.12 micron in thickness. After implanting the boron atoms to form the P type region and the P+ type region, the silicon layer is annealed at 950° C. in dry nitrogen for 15 minutes. After removing the N+ type substrate, the N+ region, having a carrier concentration of $5 \times 10^{19}$ cm$^{-3}$ and thickness of 0.25 $\mu$m is formed by implanting phosphorus ($^{31}$P+) ions at 70 KeV with a fluence of $7 \times 10^{14}$ cm$^{-2}$, leaving an N type region having a thickness of 0.12 micron. Additional phosphorus ($^{31}$P++) ions are implanted into the N type region at 260 KeV with a fluence of $1.8 \times 10^{13}$ cm$^{-2}$ to adjust the carrier concentration of the N region to $5.2 \times 10^{17}$ cm$^{-3}$.

In the method of the present invention the entire diode is formed in a single epitaxial layer. Since this epitaxial layer is much thicker than the individual layers needed to make such various regions of the diode, the thickness of and the carrier concentration in the epitaxial layer is not critical. The thickness of and the carrier concentration in the various active regions can be accurately controlled by the ion implantation steps. The various regions making up the diode in the epitaxial layer are then formed by ion implantation. This permits good control of the thicknesses required for these active regions, as well as the carrier concentration in each region. Although the silicon layer can be annealed after the boron implantation by either thermal annealing or laser annealing, after the phosphorus implantation it can only by annealed by laser annealing to prevent the metal contact from damaging the active regions on the P side of the diode. Laser annealing permits fine control of the depth of heating of the silicon layer. Thus only the surface portion of the silicon layer into which the ions were implanted will be heated to the necessary annealing temperature, thereby preventing any damage to the semiconductor diode. Thus, the present invention provides a method of making an Impatt diode capable of operating at millimeter wave frequencies in which the very thin active regions required can be accurately formed with the required carrier concentrations and doping profiles.

Although the method of the present invention has been described as forming the P type and P+ type regions (the regions of the conductivity type opposite to that of the epitaxial layer) first by implanting into the initially exposed surface of the epitaxial layer and then forming the N type and N+ type regions after removing the substrate, these operations can be reversed. Thus, the initial implants can be the phosphorus ions to form the N+ type region first and then to adjust the N type region to the desired carrier concentration. After applying the heat sink and removing the substrate the boron ion implant can be carried out to form the P type and P+ type regions. In this version of the present method, after the phosphorus ion implants the silicon layer can be annealed either by thermal annealing or laser annealing. However, after the boron implants the annealing must be by laser annealing because of the presence of the metal heat sink which cannot be subjected to high temperature annealing. Also, although the method of the present invention has been described with the substrate being of N+ type conductivity and the epitaxial layer being of N type conductivity, the conductivity of the substrate and epitaxial layers can be P+ type and P type respectively. Using a P type epitaxial layer, the implants of the phosphorus and boron would be adjusted to form the desired active regions.

We claim:

1. A method of making an Impatt diode capable of operating at millimeter-wave frequencies comprising the steps of:
   (a) epitaxially depositing a layer of semiconductor material of one conductivity type on a substrate
   (b) implanting into the first exposed surface of said layer conductivity modifiers to form a first active region across the layer,
   (c) removing the substrate to expose the other surface of said layer, and
   (d) implanting into said other surface of said layer conductivity modifiers to form a second active region with a PN junction being between the active regions.

2. A method in accordance with claim 1 wherein the conductivity modifiers implanted in step (b) are of the conductivity type opposite to that of the layers so as to form a PN junction across the layers, and the conductivity modifiers implanted in step (d) are of the same conductivity type as the layers to form a high conductivity region of said one conductivity type along said other surface of the layer with the second active region being between said high conductivity region and the PN junction.

3. A method in accordance with claim 1 or 2 in which after step (b) and step (c) the step of forming a thick metal layer on said first surface of the layer.

4. A method in accordance with claim 3 in which following the various implantation steps the surface of the layer into which the various conductivity modifiers were implanted are annealed.

5. A method in accordance with claim 4 in which the other surface of the layer is annealed by laser annealing, either CW or pulsed laser annealing.

6. A method in accordance with claim 5 in which both surfaces of the layer are annealed by laser annealing either CW or pulsed laser annealing.

7. A method in accordance with claim 2 in which inbetween steps (b) and (c) additional conductivity modifiers of the opposite conductivity type are implanted into said first exposed surface to a distance spaced from the PN junction to form a high conductivity region of said opposite conductivity type along said first surface of the layer.

8. A method in accordance with claim 7 in which the substrate is removed by etching.

9. A method in accordance with claim 8 in which the substrate is of the same semiconductor material and same conductivity type as the layer but of a high conductivity and is at least partially removed by a selective etchant which etches the material of the substrate but substantially stops etching at the layer.

10. A method in accordance with claim 7 in which step (d) is carried out to form high conductivity region which is spaced from the PN junction and is followed by implanting additional conductivity modifiers of the one conductivity type through the other surface of the layer onto the region between the PN junction and the high conductivity region to adjust the conductivity of said region.

11. A method of making an Impatt diode capable of operating at millimeter wave frequencies comprising the steps of:
   (a) epitaxially depositing a layer of semiconductor material of one conductivity type on a substrate,
   (b) implanting into the first exposed surface of said layer conductivity modifiers of the opposite conductivity type to form a PN junction across the layer,
   (c) implanting into said first exposed surface of said layer additional conductivity modifiers of the opposite conductivity type to form a high conductivity region of said one conductivity type across said first exposed surface but spaced from said PN junction,
   (d) annealing said layer,
   (e) forming a metal heat sink on said first exposed surface,
   (f) removing the substrate to expose the other surface of said layer,
   (g) implanting into said other surface of said layer conductivity modifiers of the one conductivity type to form a high conductivity region of said one conductivity type along said other surface of the layer but spaced from said PN junction,
   (h) implanting into said other surface of said other layer additional conductivity modifiers of the one conductivity type to adjust the carrier concentration in the region between the PN junction and the high conductivity region formed in step (g), and
   (i) annealing the layer.

12. The method in accordance with claim 11 in which step (i) is carried out by laser annealing.

13. The method in accordance with claim 12 in which after step (i) a metal contact is applied to the said other surface of the layer.

* * * * *